United States Patent
Chen et al.

(10) Patent No.: US 10,365,829 B2
(45) Date of Patent: Jul. 30, 2019

(54) MEMORY TRANSACTION-LEVEL MODELING METHOD AND SYSTEM

(71) Applicant: INDUSTRIAL TECHNOLOGY RESEARCH INSTITUTE, Chutung, Hsinchu (TW)

(72) Inventors: Yao-Hua Chen, Changhua County (TW); Che-Wei Hsu, Taipei (TW); Juin-Ming Lu, Hsinchu (TW); Wei-Shiang Lin, New Taipei (TW); Jing-Jia Liou, Hsinchu (TW); Chih-Tsun Huang, Hsinchu (TW)

(73) Assignee: INDUSTRIAL TECHNOLOGY RESEARCH INSTITUTE, Chutung, Hsinchu (TW)

( * ) Notice: Subject to any disclaimer, the term of this patent is extended or adjusted under 35 U.S.C. 154(b) by 302 days.

(21) Appl. No.: 15/391,082

(22) Filed: Dec. 27, 2016

(65) Prior Publication Data

US 2018/0074702 A1    Mar. 15, 2018

(30) Foreign Application Priority Data

Sep. 10, 2016 (TW) .............................. 105129513 A

(51) Int. Cl.
G06F 3/00 (2006.01)
G06F 3/06 (2006.01)
G06F 12/02 (2006.01)
G06F 12/06 (2006.01)
G11C 7/22 (2006.01)

(52) U.S. Cl.
CPC ............ G06F 3/061 (2013.01); G06F 3/0653 (2013.01); G06F 3/0659 (2013.01);
(Continued)

(58) Field of Classification Search
None
See application file for complete search history.

(56) References Cited

U.S. PATENT DOCUMENTS

| 6,053,948 A | 4/2000 | Vaidyanathan et al. |
| 6,970,852 B1 | 11/2005 | Sendo et al. |
| 8,275,597 B1 | 9/2012 | Oh et al. |
| 8,706,453 B2 | 4/2014 | Braun et al. |

(Continued)

FOREIGN PATENT DOCUMENTS

| CN | 103778970 A | 5/2014 |
| CN | 103093016 B | 6/2016 |
| TW | 201224748 A | 6/2012 |

OTHER PUBLICATIONS

Yoongu Kim et al; Ramulator: A Fast and Extensible Dram Simulator; IEEE Computer Architecture Letters, vol. 15, No. 1, Jan.-Jun. 2016; 5 pgs.

(Continued)

Primary Examiner — Midys Rojas
(74) Attorney, Agent, or Firm — Muncy, Geissler, Olds & Lowe, P.C.

(57) ABSTRACT

A memory transaction-level modeling method and a memory transaction-level modeling system are provided. The memory transaction-level modeling method is used for simulating the operation of outputting at least one command to the memory. The memory includes a plurality of banks each of which corresponds with a bank status table. The memory transaction-level modeling method includes the following steps: An event is received. Whether one of the bank status tables is needed to be updated is determined. If one of the bank status tables is needed to be updated, this bank status table is recovered according to a TMP queue. A command is outputted to the memory according to a command queue. The outputted command is stored in the TMP queue. Some of the bank status tables are updated and others of the bank status tables are kept unchanged.

30 Claims, 11 Drawing Sheets

(52) U.S. Cl.
CPC ........ *G06F 3/0673* (2013.01); *G06F 12/0215* (2013.01); *G06F 12/0607* (2013.01); *G11C 7/22* (2013.01)

(56) References Cited

U.S. PATENT DOCUMENTS

| | | | |
|---|---|---|---|
| 8,793,628 | B1 | 7/2014 | Varma |
| 8,943,449 | B1 | 1/2015 | Varma |
| 8,949,519 | B2 | 3/2015 | Rajan et al. |
| 9,471,726 | B2 | 10/2016 | Kumar et al. |
| 2005/0188275 | A1 | 8/2005 | Maly et al. |
| 2010/0169580 | A1 | 7/2010 | Sheaffer et al. |
| 2011/0307847 | A1 | 12/2011 | Liao et al. |
| 2012/0089385 | A1 | 4/2012 | Hsu et al. |
| 2012/0109616 | A1 | 5/2012 | Chang et al. |
| 2015/0193568 | A1 | 7/2015 | Mehta |
| 2017/0169150 | A1* | 6/2017 | Chen .................. G06F 17/5031 |

OTHER PUBLICATIONS

Matthew Poremba et al.; NVmain 2.0: A User-Friendly Memory Simulator to Model (Non-) Volatile Memory Systems; IEEE Computer Architecture Letters, vol. 14, No. 2, Jul.-Dec. 2015; 4 pgs.

Matt Poremba et al.; NVmain: An Architectural-Level Main Memory Simulator for Emerging Non-Volatile Memories; 2012 IEEE Computer Society Annual Symposium on VLSI; 6 pgs.

Andreas Hansson et al; Simulating DRAM Controllers for Future System Architecture Exploration; 2014 IEEE; 10 pgs.

Hsiu-Chuan Shih et al.; Dart: A Component-Based DRAM Area, Power, and Timing Modeling Tool; IEEE Transactions on Computer-Aided Design of Intergrated Circuits and Systems; vol. 33, No. 9, Sep. 2014; 14 pgs.

Niladrish Chatterjee et al; USIMM: The Utah Simulated Memory Module—A Simulation Infrastructure for the JWAC Memory Scheduling Championship; University of Utah and Intel Corp.; Feb. 20, 2012; 24 pgs.

Paul Rosenfeld et al., DRAMSims2: A Cycle Accurate Memory System Simulator; IEEE Computer Architecture Letters, vol. 10, No. 1, Jan.-Jun. 2011; 4 pgs.

Marc Greenberg; Architectural Options for LPDDR4 Implementation in Your Next Clip Design; Global Standards for the Microelectronics Industry; JEDEC Mobile & IOT Forum; 2016; 36 pgs.

Micron Technology, Inc.; Mobile LPDDR3 SDRAM; 168-Ball Mobile LPDDR3 SDRAM Features; 2014; 1 pg.

ITRS; International Technology Roadmad for Semiconductors; 2011 Edition; Design; 52 pgs.

* cited by examiner

MEMORY TRANSACTION-LEVEL MODELING METHOD AND SYSTEM

This application claims the benefit of Taiwan application Serial No. 105129513, filed Sep. 10, 2016, the disclosure of which is incorporated by reference herein in its entirety.

TECHNICAL FIELD

The disclosure relates in general to a transaction-level modeling method and a transaction-level modeling method system, and more particularly to a memory transaction-level modeling method and a memory transaction-level modeling method system.

BACKGROUND

Along with the increasing system design complexity, an electronic system level design method is suggested by the ITRS (International Technology Roadmap for Semiconductors) to improve the system performance. In this method, the transistor, the gate, and the register are upgraded to the transaction-level.

In a transaction-level model, the simulating efficiency is a challenge. Due to the increasing system design complexity, the researchers endeavor to create some inventive methods to improve the simulating efficiency.

SUMMARY

The disclosure is directed to a memory transaction-level modeling method and a memory transaction-level modeling system. Only some of a plurality of bank status tables are updated, such that the efficiency of the memory transaction-level modeling method is greatly improved.

According to one embodiment, a memory transaction-level modeling method is provided. The memory transaction-level modeling method is used for simulating an operation of outputting at least one command to a memory. The memory includes a plurality of banks each of which corresponds with a bank status table. The memory transaction-level modeling method comprises the following step: An event is received. Whether one of the bank status tables is needed to be recovered is determined. One of the bank status tables which is needed to be recovered is recovered according to a temporary queue (TMP queue). The at least one command is outputted to the memory according to a command queue and the outputted command is stored in the TMP queue. Some of the bank status tables are updated and others of the bank status tables are kept unchanged.

According to another embodiment, a memory transaction-level modeling system is provided. The memory transaction-level modeling system is used for simulating an operation of outputting at least one command to a memory. The memory includes a plurality of banks each of which corresponds with a bank status table. The memory transaction-level modeling system includes a recovery determining unit, a recovering unit, an input and output unit, a queue managing unit and a partial updating unit. The recovery determining unit is for determining whether one of the bank status tables is needed to be recovered. The recovering unit is for recovering one of the bank status tables which is needed to be recovered according to a temporary queue (TMP queue). The input and output unit is for outputting the at least one command to the memory according to a command queue. The queue managing unit is for storing the outputted command in the TMP queue. The partial updating unit is for updating some of the bank status tables and keeping others of the bank status tables unchanged.

Figure 1:
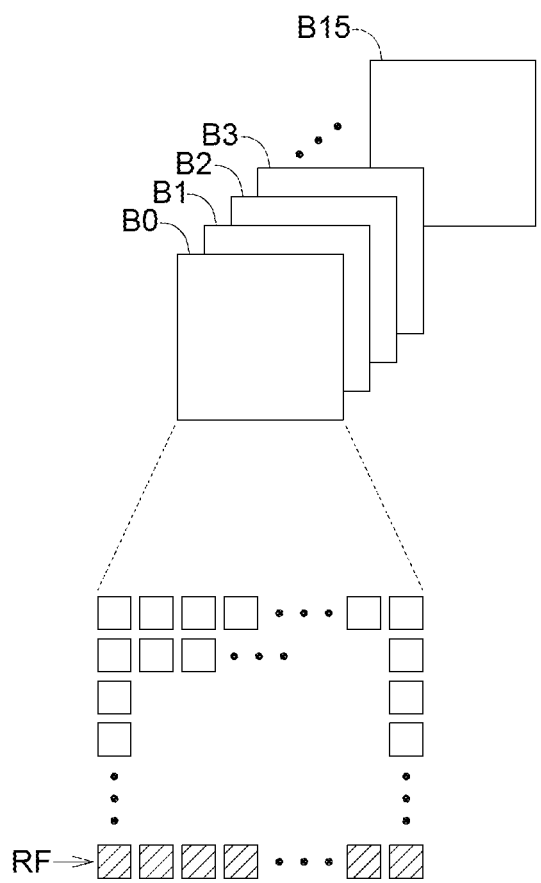
FIG. 1 shows a memory.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Please refer to FIG. 1, which shows a memory MR. For example, the memory MR may be a Dynamic Random Access Memory (DRAM). DRAM is organized in arrays of rows and columns, banks, and ranks. The Activate command (A) can be used to open a specific row of the memory array, transferring the data on the entire row to row buffer. Then the Read (R) or Write (W) command can load or store the data. An active row has to be precharged by the Precharge command (P) before another row can be activated. In auto-precharge mode, the row to be accessed is precharged at the end of read or write command, which is also known as the close page policy. In this case, a read with precharge (RP) command or write with precharge (WP) command is used instead of an individual read or write. On the other hand, consecutive reads or writes on the same row with-out re-precharge and re-activate are possible with the open page policy. Without loss of generality, the close page policy is discussed in this patent. However, the open page one can be supported without difficulty. In the present embodiment, the memory MR can be a physical structure of the memory or a software/hardware model of a memory. The memory MR includes a plurality of banks, such as a 0th bank (bank 0) B0, a 1st bank (bank 1) B1, a 2nd bank (bank 2) B2, a 3rd bank (bank 3) B3, . . . , a 15th bank (bank 15) B15. Each of the banks, such as the 0th bank B0 to the 15th bank B15, includes a plurality of columns of memory cells and a plurality of rows of memory cells. In the 0th bank B0 to the 15th bank B15, there is a row buffer RF for each bank. When data is going to be written into the memory MR, the data is temporarily stored in the row buffer RF. Then, the data is transmitted to a particular storage unit. Similarly, when data in the memory MR is going to be read out, the data is temporarily stored in the row buffer RF. Then, the data is outputted.

Figure 2:
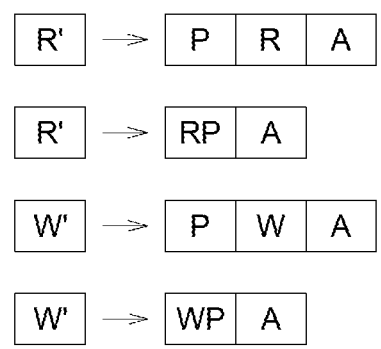
FIG. 2 shows the relationship between a plurality of request events and a plurality of commands.

Because the writing operation and the reading operation of the memory MR is performed via the row buffer RF, it is needed to control the row buffer RF. Please refer to FIG. 2, which shows the relationship between a plurality of request events and a plurality of commands. When the memory MR receives a read request event R', an active command A, a read command R and a pre-charge command P will be performed. The active command A is used to active an access path of the row buffer RF. The read command R is used to read data. The pre-charge command P is used to move the data stored in the row buffer RF to the corresponding bank (one of 0th bank B0 to the 15th bank B15), such that the row buffer RF can be used at next time. Under a command order restriction, the active command A would be performed before the read command R, the read command R would be performed before the pre-charge command P. In another command order restriction, the pre-charge command P may be omitted.

In another embodiment, when the memory MR receives the read request event R', the active command A and a read with pre-charge command RP will be performed. The active command A is used to active the access path of the row buffer RF. The read with pre-charge command RP is used to read data and clean the row buffer RF. Under a command order restriction, the active command A would be performed before the read with pre-charge command RP.

When the memory MR receives a write request event W', the active command A, a write command W and the pre-charge command P will be performed. The active command A is used to active the access path of the row buffer RF. The write command W is used to write data. The pre-charge command P is used to clean the row buffer RF, such that the row buffer RF can be used at next time. Under a command order restriction, the active command A would be performed before the write command W, and the write command W would be performed before the pre-charge command P. In another command order restriction, the pre-charge command P may be omitted.

In another embodiment, when the memory MR receives the write request event W, the active command A and a write with pre-charge command WP will be performed. The active command A is used to active the access path of the row buffer RF. The write with pre-charge command WP is used to write data and clean the row buffer RF. Under a command order restriction, the active command A would be performed before the write with pre-charge command WP.

In the following illustration, when the read request event R' is received, the active command A and the read with pre-charge command RP will be performed accordingly; when the write request event W' is received, the active command A and the write with pre-charge command WP will be performed accordingly.

Base on above, each of the banks includes the row buffer RF. When the 0th bank B0 receives the read request event R0' and the 1st bank B1 receives a read request event R1', an active command A0 and the read with pre-charge command RP0 will be performed in the 0th bank B0, an active command A1 and a read with pre-charge command RP1 will be performed in the 1st bank B1. Because the row buffer RF in the 0th bank B0 and the row buffer RF in the 1st bank B1 are independent, the read with pre-charge command RP1 can be performed even if the read with pre-charge command RP0 is still performing and not finished yet. The active command A0, the read with pre-charge command RP0, the active command A1 and the read with pre-charge command RP1 can be adaptively scheduled to improve the system efficiency.

Please refer to table 1, which illustrates the timing constraints between two commands. For example, refer to the 3rd row on the table 1. In the same bank, after the active command A is performed, at least 4 cycles are needed before performing the read with pre-charge command RP (or the read command R). Refer to the 7th row on the table 1. In the same bank, after the read with pre-charge command RP is performed, at least 7 cycles are needed before performing another read with pre-charge command RP (or the read command R). Refer to the 14th row on the table 1. In different banks, after the active command A is performed, at least 3 cycles are needed before performing another active command A. Other timing constraints between two commands which are shown in the table 1 can be illustrated similarly as above. For the timing constraints between of two commands which are not shown in the table 1, at least 1 cycle is needed to space those two commands.

TABLE 1

| Previously performed command | The command to be performed | Number of cycles between two consecutive commands |
|---|---|---|
| In same bank | | |
| active command A | read command R or read with pre-charge command RP | 4 |
| active command A | write command W or write with pre-charge command WP | 4 |
| active command A | active command A | 18 |
| read with pre-charge command RP | active command A | 7 |
| read with pre-charge command RP | read command R or read with pre-charge command RP | 7 |
| read with pre-charge command RP | write command W or write with pre-charge command WP | 7 |
| write with pre-charge command WP | active command A | 14 |
| write with pre-charge command WP | read command R or read with pre-charge command RP | 14 |
| write with pre-charge command WP | write command W or write with pre-charge command WP | 14 |
| In different banks | | |
| active command A | active command A | 3 |
| read with pre-charge command RP | read command R or read with pre-charge command RP | 2 |
| read with pre-charge command RP | write command W or write with pre-charge command WP | 4 |

TABLE 1-continued

| Previously performed command | The command to be performed | Number of cycles between two consecutive commands |
|---|---|---|
| write with pre-charge command WP | read command R or read with pre-charge command RP | 8 |
| write with pre-charge command WP | write command W or write with pre-charge command WP | 2 |

Figure 3:
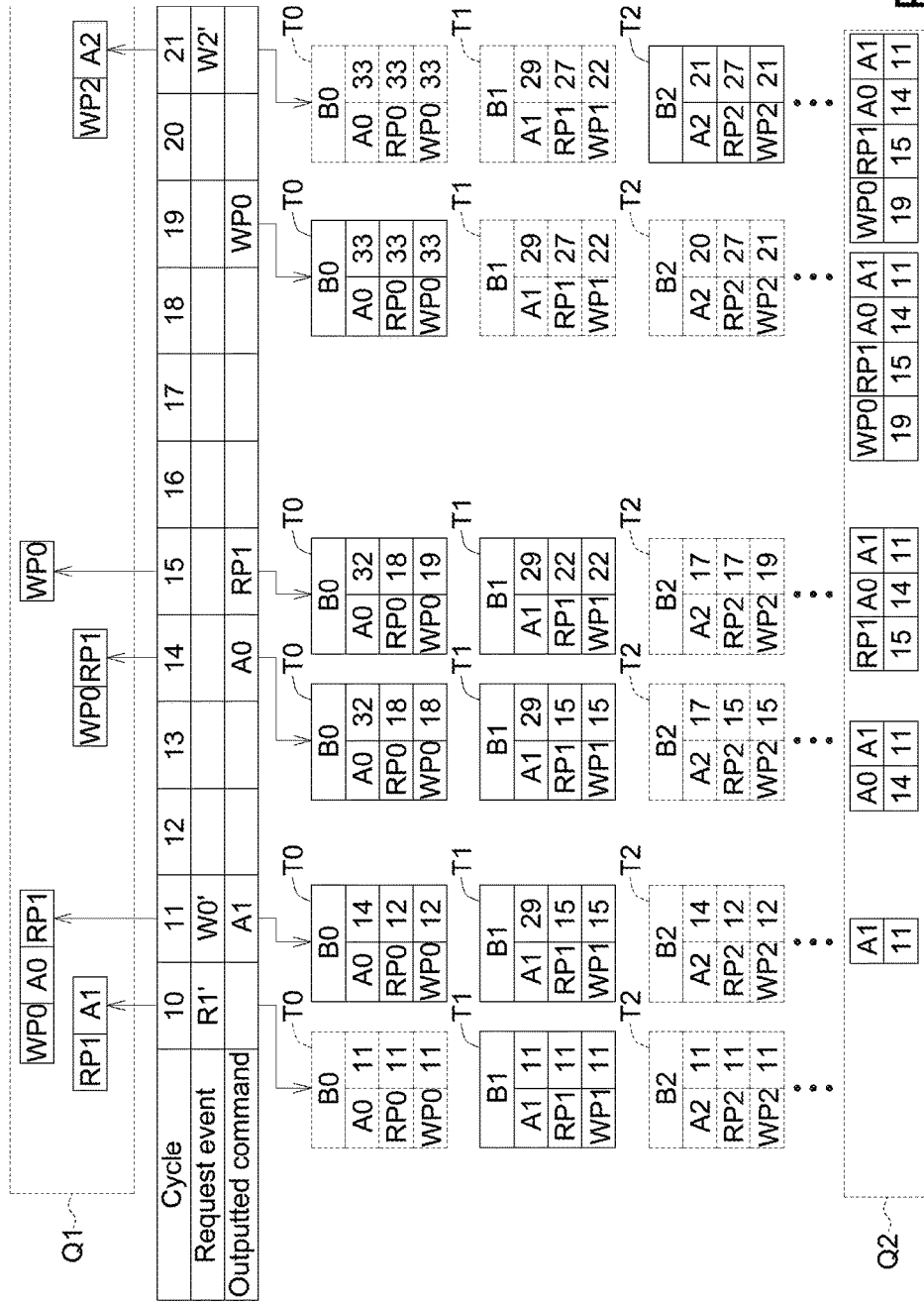
FIG. 3 illustrates a cycle-based memory transaction-level modeling method according to one embodiment.

The memory transaction-level modeling method of the present disclosure may be a cycle-based memory transaction-level modeling method, a window-based memory transaction-level modeling method, or an event-based memory transaction-level modeling method. In this embodiment, the cycle-based memory transaction-level modeling method is taken as an example for illustrating. Please refer to FIG. 3, which illustrates the cycle-based memory transaction-level modeling method according to one embodiment. The cycle-based memory transaction-level modeling method is for simulating receiving an event and outputting the corresponding commands to a memory. In FIG. 3, the read request event R1' is received at the 10th cycle. The read request event R1' requests for reading data in the 1st bank B1. According to the read request event R1', the active command A1 and the read with pre-charge command RP1 for the 1st bank B1 are stored in a command queue Q1. In the present embodiment, the command queue Q1 is used for storing some commands to be performed.

At the 10th cycle, only the command of the 1st bank B1 is stored in the command queue Q1, and no command is outputted at this time. Therefore, only a bank status table T1 corresponding with the 1st bank B1 is needed to be updated, and a bank status table T0 corresponding with the 0th bank B0, a bank status table T2 corresponding with the 2nd bank B2 and other bank status tables corresponding with other banks are not needed to be updated. In the present embodiment, the bank status table T1 records the available outputting time of each of the commands, such as the active command A1, the read with pre-charge command RP1 or the write with pre-charge command WP1, outputted to the 1st bank B1. The bank status table T0 and the bank status table T2 are similar to the bank status table T1, and the similarities are not repeated here. In FIG. 3, any bank status table which is needed to be updated, such as the bank status table T1, is shown by a solid line, and any bank status table which is not needed to be updated, such as the bank status table T0 or the bank status table T2, is shown by a dotted line. For easily understanding, the content of the bank status table T0 or the bank status table T2 is still shown in FIG. 3. In fact, at the 10th cycle, the bank status table T0 or the bank status table T2 does not need to record any content.

No commend is previously performed. Therefore, it is needed to wait for 1 cycle before any command to be performed in the 1st bank B1. Therefore, in the bank status table T1, the available outputting time of the active command A1 is the 11th cycle (10+1), the available outputting time of the read with pre-charge command RP1 is the 11th cycle (10+1), and the available outputting time of the write with pre-charge command WP1 is the 11th cycle (10+1).

At the 10th cycle, the active command A1 and the read with pre-charge command RP1 are stored in the command queue Q1. According to the bank status table T1, the available outputting time of each of those two commands is the 11th cycle. According to the command order restriction, the active command A1 would be performed before the read with pre-charge command RP1, so the command which can be performed at the 11th cycle is the active command A1.

Then, at the 11th cycle, the active command A1 is outputted, the active command A1 is removed from the command queue Q1, and the active command A1 and the outputting time thereof are stored in a temporary queue (TMP queue) Q2. At the 11th cycle, a write request event W0' is received. The write request event W0' requests for writing data in the 0th bank B0. According to the write request event W0', the active command A0, and a write with pre-charge command WP0 for the 0th bank B0 are stored in the command queue Q1. Now, the command queue Q1 stores the read with pre-charge command RP1, the active command A0 and the write with pre-charge command WP0 which are not outputted yet.

At the 11th cycle, the commands of the 0th bank B0 and the 1st bank B1 are stored in the command queue Q1, and only the command of the 1st bank B1 is outputted at this time. Therefore, only the bank status table T0 corresponding with the 0th bank B0 and the bank status table T1 corresponding with the 1st bank B1 are needed to be updated, and the bank status table T2 corresponding with the 2nd bank B2 and other bank status tables corresponding with other banks are not needed to be updated.

According to the 14th row on the table 1, after the active command A1 is performed, at least 3 cycles are needed for spacing the previously performed active command A1 and the active command A0 to be performed. Therefore, in the bank status table T0, the available outputting time of the active command A0 is the 14th cycle (11+3). According to the table 1, after the active command A1 is performed, at least 1 cycle is needed for spacing the previously performed active command A1 and the read with pre-charge command RP0 to be performed which is not shown in the table 1, and at least 1 cycle is needed for spacing the previously performed active command A1 and the write with pre-charge command WP0 to be performed which is not shown in the table 1. Therefore, in the bank status table T0, the available outputting time of the read with pre-charge command RP0 is the 12th cycle (11+1), and the available outputting time of the write with pre-charge command WP0 is the 12th cycle (11+1).

According to the 5th row on the table 1, after the active command A1 is performed, at least 18 cycles are needed for spacing the previously performed active command A1 and the active command A1 to be performed. Therefore, in the bank status table T1, the available outputting time of the active command A1 is the 29th cycle (11+18). According to the 3rd row on the table 1, after the active command A1 is performed, at least 4 cycles are needed for spacing the previously performed active command A1 and the read with pre-charge command RP1 to be performed. Therefore, in the bank status table T1, the available outputting time of the read with pre-charge command RP1 is the 15th cycle (11+4). According to the 4th row on the table 1, after the active command A1 is performed, at least 4 cycles are needed for spacing the previously performed active command A1 and the write with pre-charge command WP1 to be performed. In the bank status table T1, the available outputting time of the write with pre-charge command WP1 is the 15th cycle (11+4).

At the 11th cycle, the read with pre-charge command RP1, the active command A0 and the write with pre-charge command WP0 are stored in the command queue Q1. According to the bank status tables T0, T1, the available outputting time of the write with pre-charge command WP0 is the 12th cycle, the available outputting time of the active command A0 is the 14th cycle, and the available outputting time of the read with pre-charge command RP1 is the 15th cycle. Therefore, the available outputting time of the write with pre-charge command WP0 is earlier than the available outputting time of the active command A0, and the available outputting time of the active command A0 is earlier than the available outputting time of the read with pre-charge command RP1. According to the command order restriction, the active command A0 would be performed before the write with pre-charge command WP0, so the command which can be performed at the 14th cycle is the active command A0.

Next, at the 14th cycle, the active command A0 is outputted, the active command A0 is removed from the command queue Q1, and the active command A0 and the outputting time thereof are stored in the TMP queue Q2. Now, the command queue Q1 stores the read with pre-charge command RP1 and the write with pre-charge command WP0; the TMP queue Q2 stores the active command A1 and the active command A0.

At the 14th cycle, the commands of the 0th bank B0 and the 1st bank B1 are stored in the command queue Q1, and only the command of the 0th bank B0 is outputted at this time. Therefore, only the bank status table T0 corresponding with the 0th bank B0 and the bank status table T1 corresponding with the 1st bank B1 are needed to be updated, and the bank status table T2 corresponding with the 2nd bank B2 and other bank status tables corresponding with other banks are not needed to be updated.

According to the 5th row on the table 1, after the active command A0 is performed, at least 18 cycles are needed for spacing the previously performed active command A0 and another active command A0 to be performed. Therefore, in the bank status table T0, the available outputting time of the active command A0 is the 32th cycle (14+18). According to the 3rd row on the table 1, after the active command A0 is performed, at least 4 cycles are needed for spacing the previously performed active command A0 and the read with pre-charge command RP0 to be performed. Therefore, in the bank status table T0, the available outputting time of the read with pre-charge command RP0 is the 18th cycle (14+4). According to the 4th row on the table 1, after the active command A0 is performed, at least 4 cycles are needed for spacing the previously performed active command A0 and the write with pre-charge command WP0 to be performed. In the bank status table T0, the available outputting time of the write with pre-charge command WP0 is the 18th cycle (14+4).

According to the 14th row on the table 1, after the active command A0 is performed, at least 3 cycles are needed for spacing the preciously performed active command A0 and the active command A1 to be performed. The 17th cycle spacing the 14th cycle out 3 cycles is earlier than the 29th cycle which is previously recorded in the bank status table T1. Therefore, in the bank status table T1, the available outputting time of the active command A1 is still the 29th cycle. According to the table 1, after the active command A0 is performed, at least 1 cycle is needed for spacing the preciously performed active command A0 and the read with pre-charge command RP1 to be performed which is not shown in the table 1. Therefore, in the bank status table T1, the available outputting time of the read with pre-charge command RP1 is the 15th cycle (14+1). According to the table 1, after the active command A0 is performed, at least 1 cycle is needed for spacing the previously performed active command A0 and the write with pre-charge command WP1 to be performed which is not shown in the table 1. Therefore, in the bank status table T1, the available outputting time of the write with pre-charge command WP1 is the 15th cycle (14+1).

At the 14th cycle, the read with pre-charge command RP1 and the write with pre-charge command WP0 are stored in the command queue Q1. According to the bank status tables T0, T1, the earliest of the available outputting times of those commands is the available outputting time of the read with pre-charge command RP1 which is the 15th cycle. According to the command order restriction, there is no order restriction between the read with pre-charge command RP1 and the write with pre-charge command WP0, so the command which can be performed at the 15th cycle is the read with pre-charge command RP1.

Afterwards, at the 15th cycle, the read with pre-charge command RP1 is outputted, the read with pre-charge command RP1 is removed from the command queue Q1, and the read with pre-charge command RP1 and the outputting time is stored in the TMP queue Q2. Now, the command queue Q1 stores the write with pre-charge command WP0; the TMP queue Q2 stores the active command A1, the active command A0 and the read with pre-charge command RP1.

At the 15th cycle, the command of the 0th bank B0 is stored in the command queue Q1, and the command of the 1st bank B1 is outputted at this time. Therefore, only the bank status table T0 corresponding with the 0th bank B0 and the bank status table T1 corresponding with the 1st bank B1 are needed to be updated, and the bank status table T2 corresponding with the 2nd bank B2 and other bank status tables corresponding with other banks are not needed to be updated.

According to the table 1, after the read with pre-charge command RP1 is performed, at least 1 cycle is needed for spacing the previously performed read with pre-charge command RP1 and the active command A0 to be performed which is not shown in the table 1. The cycle spacing the 15th cycle out 1 cycle is the 16th cycle. The 16th cycle is earlier than the 32th cycle which is previously recorded in the bank status table T0. Therefore, in the bank status table T0, the available outputting time of the active command A0 is still the 32th cycle. According to the 15th row on the table 1, after the read with pre-charge command RP1 is performed, at least 2 cycles are needed for spacing the previously performed read with pre-charge command RP1 and the read with pre-charge command RP0 to be performed. The cycle spacing the 15th cycle out 2 cycles is the 17th cycle. The 17th cycle is earlier than the 18th cycle which is previously recorded in the bank status table T0. Therefore, in the bank status table T0, the available outputting time of the read with pre-charge command RP0 is still the 18th cycle. According to the 16th row on the table 1, after the read with pre-charge command RP1 is performed, at least 4 cycles are needed for spacing the previously performed read with pre-charge command RP1 and the write with pre-charge command WP0 to be performed. Therefore, in the bank status table T0, the available outputting time of the write with pre-charge command WP0 is the 19th cycle (15+4).

According to the 6th row on the table 1, after the read with pre-charge command RP1 is performed, at least 7 cycles are needed for spacing the previously performed read with pre-charge command RP1 and the active command A1 to be performed. The 22th cycle spacing the 15th cycle out 7 cycles is earlier than the 29th cycle which is previously recorded in the bank status table T1. Therefore, in the bank status table T1, the available outputting time of the active command A1 is still the 29th cycle. According to the 7th row on the table 1, after the read with pre-charge command RP1 is performed, at least 7 cycles are needed for spacing the previously performed read with pre-charge command RP1 and another read with pre-charge command RP1 to be performed. Therefore, in the bank status table T1, the available outputting time of the read with pre-charge command RP1 is the 22th cycle (15+7). According to the 7th row on the table 1, after the read with pre-charge command RP1 is performed, at least 7 cycles are needed for spacing the previously performed read with pre-charge command RP1 and the write with pre-charge command WP1 to be performed. Therefore, in the bank status table T1, the available outputting time of the write with pre-charge command WP1 is the 22th cycle (15+7).

At the 15th cycle, the write with pre-charge command WP0 is stored in the command queue Q1. According to the bank status table T0, the available outputting time of the write with pre-charge command WP0 is the 19th cycle.

Next, at the 19th cycle, the write with pre-charge command WP0 is outputted, the write with pre-charge command WP0 is removed from the command queue Q1 , and the write with pre-charge command WP0 and the outputting time thereof are stored in the TMP queue Q2. Now, the command queue Q1 stores nothing; the TMP queue Q2 stores the active command A1, the active command A0, the read with pre-charge command RP1 and the write with pre-charge command WP0.

At the 19th cycle, the command queue Q1 stores nothing, and only the command of the 0th bank B0 is outputted at this time. Therefore, only the bank status table T0 corresponding with the 0th bank B0 is needed to be updated, and the bank status table T1 corresponding with the 1st bank B1, the bank status table T2 corresponding with the 2nd bank B2 and other bank status tables corresponding with other banks are not needed to be updated.

According to the 9th row on the table 1, after the write with pre-charge command WP0 is performed, at least 14 cycles are needed for spacing the previously performed write with pre-charge command WP0 and the active command A0 to be performed. Therefore, in the bank status table T0, the available outputting time of the active command A0 is the 33th cycle (19+14). According to the 10th row on the table 1, after the write with pre-charge command WP0 is performed, at least 14 cycles are needed for spacing the previously performed write with pre-charge command WP0 and the read with pre-charge command RP0 to be performed. Therefore, in the bank status table T0, the available outputting time of the read with pre-charge command RP0 is the 33th cycle (19+14). According to the 11th row on the table 1, after the write with pre-charge command WP0 is performed, at least 14 cycles are needed for spacing the previously performed write with pre-charge command WP0 and another write with pre-charge command WP0 to be performed. Therefore, in the bank status table T0, the available outputting time of the write with pre-charge command WP0 is the 33th cycle (19+14).

Afterwards, at the 21th cycle, a write request event W2' is received. The write request event W2' requests for writing data in the 2nd bank B2. According to the write request event W2', an active command A and a write with pre-charge command WP2 for the 2nd bank B2 are stored in the command queue Q1. Now, the command queue Q1 stores the active command A2 and the write with pre-charge command WP2.

At the 21th cycle, the commands of the 2nd bank B2 are stored in the command queue Q1, and no command is outputted at this time. Therefore, only the bank status table T2 corresponding with the 2nd bank B2 is needed to be updated, and the bank status table T0 corresponding with the 0th bank B0, the bank status table T1 corresponding with the 1st bank B1 and other bank status tables corresponding with other banks are not needed to be updated.

At the 21th cycle, if any of the bank status tables is recently updated (i.e. the 19th cycle), and the bank status table T2 corresponding with the 2nd bank B2 is not updated, then the bank status table T2 is needed to be recovered according to the TMP queue Q2. That is to say, the bank status table T2 which is shown by the dotted line can be recovered according to the active command A1, the active command A0, the read with pre-charge command RP1 and the write with pre-charge command WP0 stored in the TMP queue Q2, such that the bank status table T2 at the 21th cycle can be obtained.

Base on above, not all of the bank status tables are updated at each time. Only some of the bank status tables are updated. If necessary, the unchanged bank status table can be recovered according to the TMP queue Q2. As such, the efficiency of the memory transaction-level modeling method can be greatly improved.

Figure 4:
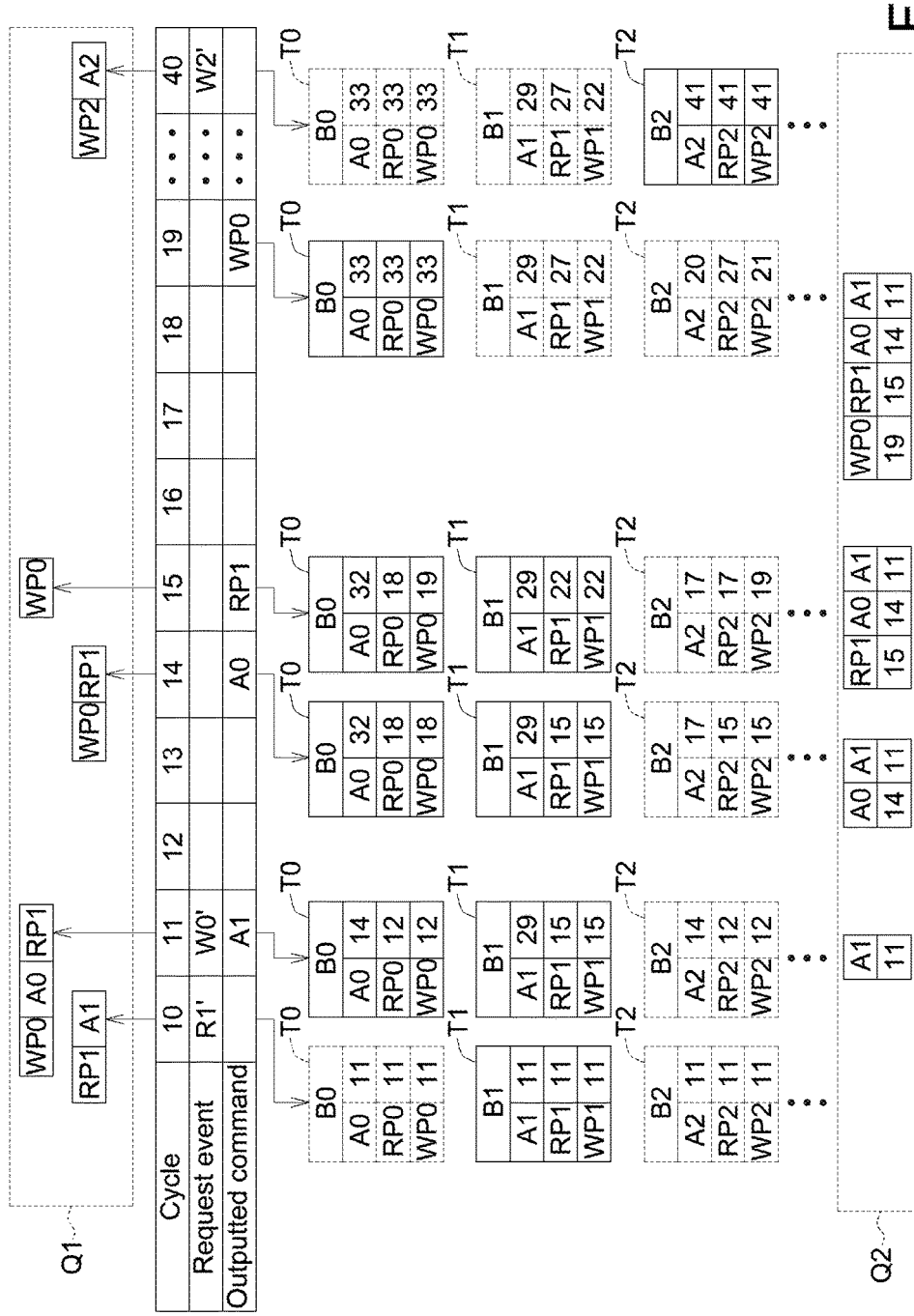
FIG. 4 illustrates a cycle-based memory transaction-level modeling method according to another embodiment.

Further, please refer to FIG. 4, which illustrates the cycle-based memory transaction-level modeling method according to another embodiment. The different between the FIG. 4 and the FIG. 3 is in that the write request event W2' is received at the 40th cycle.

At the 40th cycle, the write request event W2' is received. The write request event W2' requests for writing data in the 2nd bank B2. According to the write request event W2', the active command A2 and the write with pre-charge command WP2 for the 2nd bank B2 are stored in the command queue Q1. Now, the command queue Q1 stores the active command A2 and the write with pre-charge command WP2.

At the 40th cycle, the commands of the 2nd bank B2 are stored in the command queue Q1, and no command is outputted at this time. Therefore, only the bank status table T2 corresponding with the 2nd bank B2 is needed to be updated, and the bank status table T0 corresponding with the 0th bank B0, the bank status table T1 corresponding with the 1st bank B1 and other bank status tables corresponding with other banks are not needed to be updated.

At the 40th cycle, if any of the bank status tables is recently updated (i.e. the 19th cycle), and the bank status table T2 corresponding with the 2nd bank B2 is not updated, then bank status table T2 is needed to be recovered according to the TMP queue Q2. Please referring table 1, the maximum of the number of cycles for spacing two commands is 18. The maximum of the number of cycles for spacing two commands is a dependence interval. If a command outputted at this time spaces a previously performed command within 18 cycles, then those two commands are dependent with each other and the bank status table corresponding with the outputted command is needed to be recovered.

In other words, the commands in the TMP queue Q2 are needed to be kept for the dependence interval, i.e. 18 cycles. If the time duration of one of the commands stored in the TMP queue Q2 is longer than the dependence interval, then this command can be removed from the TMP queue Q2.

One of the bank status tables is recently updated at the 19th cycle. At the 40th cycle, the interval between the 40th cycle and the 19th cycle is larger than the dependence interval, i.e. 18, so all commands stored in the TMP queue Q2 are removed. Therefore, at the 40th cycle, it is deemed that no commend is previously performed. Only 1 cycle is needed for spacing this time and any command to be performed in the 2nd bank B2. Therefore, in the bank status table T2, the available outputting time of the active command A2 is the 41th cycle (40+1), the available outputting time of the read with pre-charge command RP2 is the 41th cycle (40+1), and the available outputting time of the write with pre-charge command WP2 is the 41th cycle (40+1).

That is to say, part of the TMP queue Q2 can be removed according to the dependence interval, such that the efficiency of recovering the bank status table can be improved.

Figure 5A:
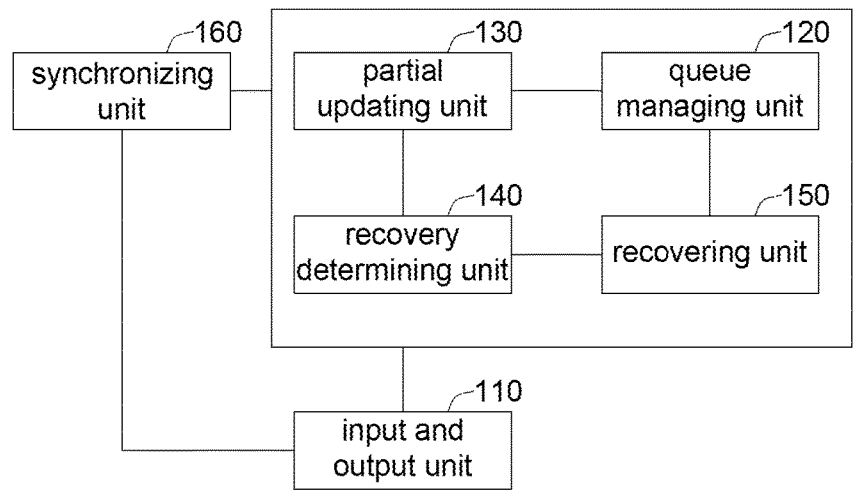
FIG. 5A shows a memory transaction-level modeling system.

Please refer to FIG. 5A, which shows the memory transaction-level modeling system 100. The memory transaction-level modeling system 100 includes an input and output unit 110, a queue managing unit 120, a partial updating unit 130, a recovery determining unit 140, a recovering unit 150 and a synchronizing unit 160.

The input and output unit 110 is used for inputting or outputting various data. The input and output unit 110 may include a bus interface, such as a slave bus interface, and may optionally include a request queue and/or a response queue. The request queue can receive a request from the bus interface and store the request. The response queue may store a response from the memory transaction-level modeling system 100 and transmit the response to the bus interface. In one embodiment, the input and output unit 110 may include an interface for outputting a command to a memory. In another embodiment, the input and output unit 110 may include a transmitting and receiving circuit. The queue managing unit 120 is used for managing the command queue Q1 and the TMP queue Q2. The partial updating unit 130 is used for updating some of the bank status tables. The recovery determining unit 140 is used for determined whether any bank status table is needed to be recovered. The recovering unit 150 is used for recovering the bank status table. The synchronizing unit 160 is used for controlling and selecting the updated basis of the memory transaction-level modeling method, such as the cycle-based memory transaction-level modeling method, the window-based memory transaction-level modeling method or the event-based memory transaction-level modeling method. Each of the queue managing unit 120, the partial updating unit 130, the recovery determining unit 140, the recovering unit 150 and the synchronizing unit 160 may be a chip, a circuit, a circuit board, a storage device storing a plurality of program codes, or a plurality of program codes executable by a computer or a server.

Figure 5B:
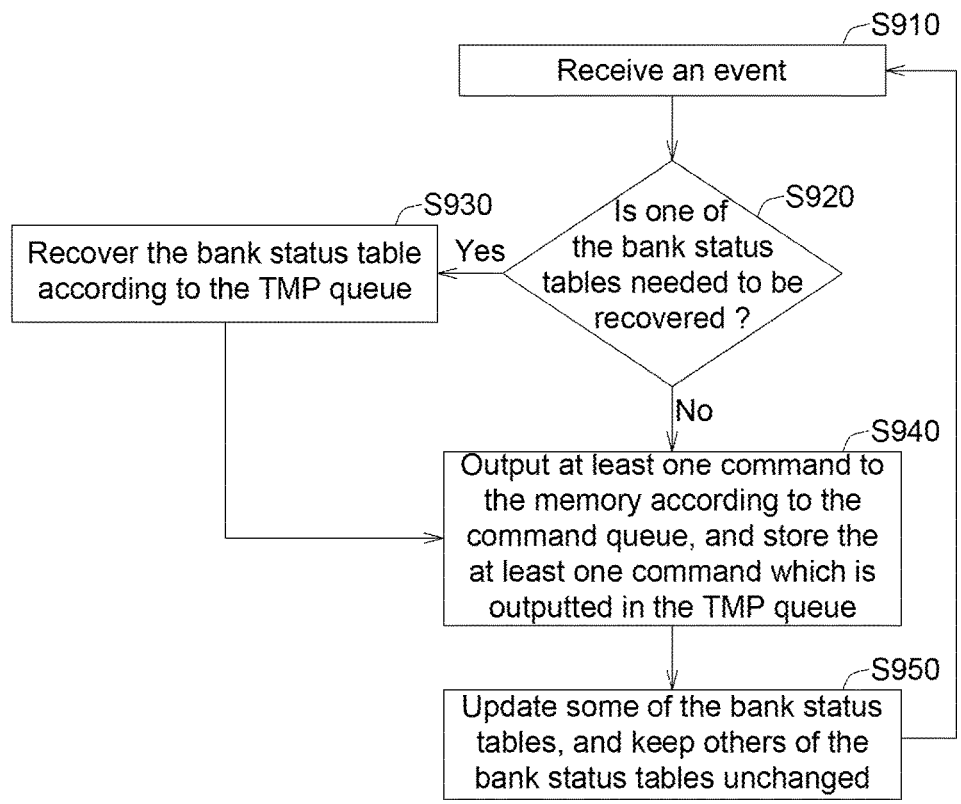
FIG. 5B shows a flowchart of a memory transaction-level modeling method according to one embodiment.

The operation of the memory transaction-level modeling system 100 of FIG. 5A is illustrated by a flowchart. Please refer to FIG. 5B, which shows a flowchart of the memory transaction-level modeling method according to one embodiment. In the step S910, an event is received. The event may be updating a timer, receiving a new request event, reaching a synchronizing time or reaching a window time.

In the step S920, the recovery determining unit 140 determines whether one of the bank status tables is needed to be recovered.

If one of the bank status tables is needed to be updated, then the process proceeds to the step S930. In the step S930, the recovering unit 150 recovers the bank status table according to the TMP queue Q2.

If none of the bank status tables is needed to be recovered, then the process proceeds to the step S940. In the step S940, the input and output unit 110 outputs at least one command to the memory according to the command queue Q1, and the queue managing unit 120 stores the at least one command which is outputted in the TMP queue Q2.

Then, in the step S950, the partial updating unit 130 updates some of the bank status tables, and keeps others of the bank status tables unchanged.

The memory transaction-level modeling method may be the cycle-based memory transaction-level modeling method, the event-based memory transaction-level modeling method, or the window-based memory transaction-level modeling method. All kinds of the memory transaction-level modeling methods are illustrated as below. The flowchart described below is not limited to the order of the steps. For example, in FIG. 5B, after the step S910 is performed, the steps S940, S950 may be performed before the steps S920, S930, and then the process returns to the step S910.

Figure 6:
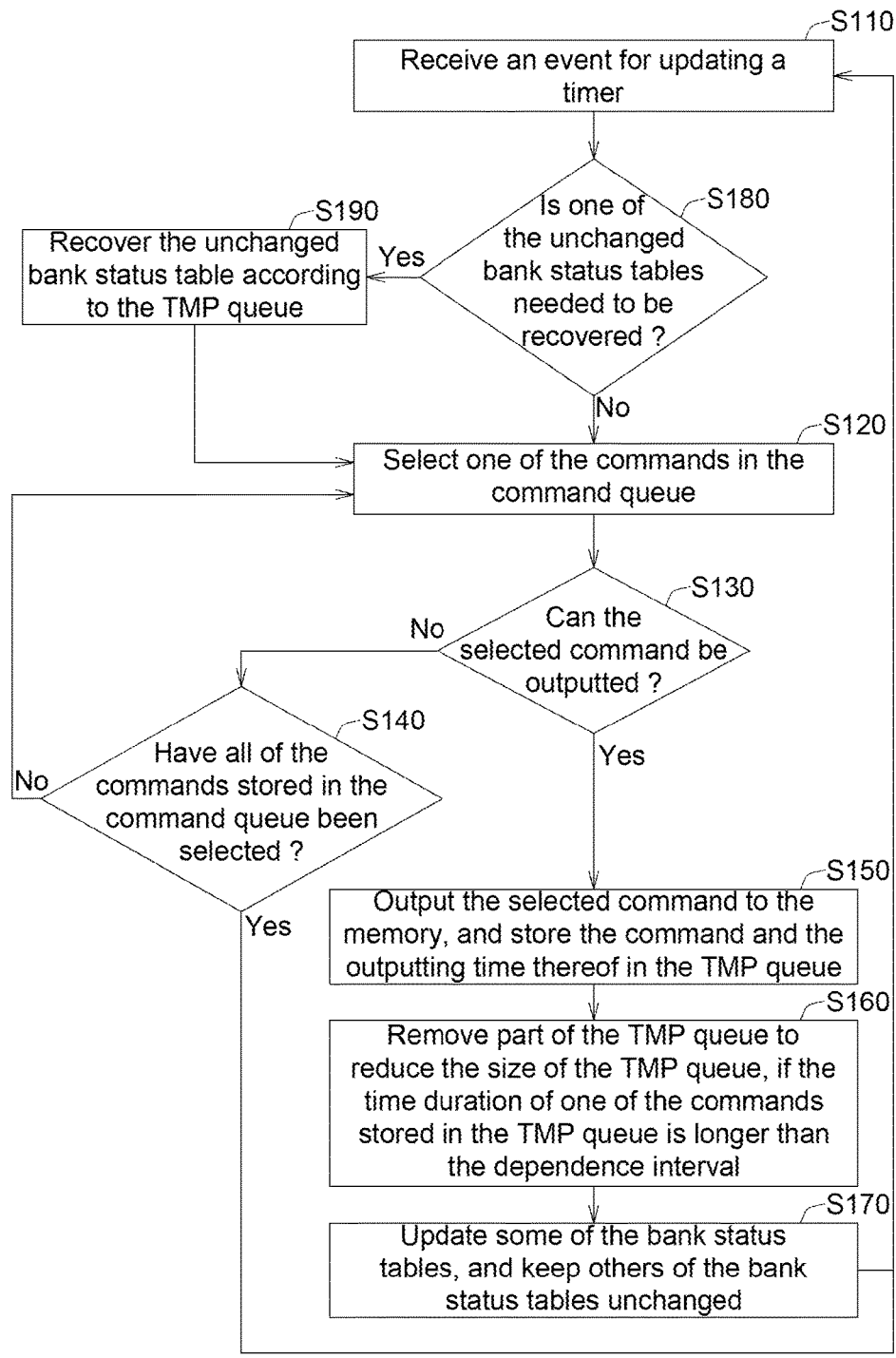
FIG. 6 shows a flowchart of a cycle-based memory transaction-level modeling method according to one embodiment.

Please refer to FIG. 6, which shows a flowchart of the cycle-based memory transaction-level modeling method according to one embodiment. In the step S110, the synchronizing unit 160 receives an event for updating a timer. For example, the timer is updated if a cycle time is reached.

When the timer is updated, in the step S180, the recovery determining unit 140 determines whether one of the unchanged bank status tables is needed to be recovered. For example, at the 21th cycle in FIG. 3, the write request event W2' is received. At the time when any of the bank status tables is recently updated (i.e. the 19th cycle), the bank status table T2 corresponding with the 2nd bank B2 is not updated, so the bank status table T2 is needed to be recovered. Any of the unchanged bank status tables which corresponds with the commands stored in the command queue Q1 is needed to be recovered; or, any of the unchanged bank status tables which corresponds with the outputted commands is needed to be recovered. In one embodiment, when the timer is updated and a new request event is received, the commands correspond with the new request event are stored in the command queue Q1.

If none of the unchanged bank status tables is needed to be recovered, the process proceeds to the step S120. If one of the unchanged bank status tables is needed to be recovered, the process proceeds to the step S190. In the step S190, the recovering unit 150 recovers the unchanged bank status table according to the TMP queue Q2. In detail, the recovering unit 150 recovers the bank status table according to the commands and/or the outputting time thereof in the TMP queue Q2.

Next, in the step S120, the queue managing unit 120 selects one of the commands in the command queue Q1. For example, at the 14th cycle in FIG. 3, the read with pre-charge command RP1, the active command A0 and the write with pre-charge command WP0 are stored in the command queue Q1, and the read with pre-charge command RP1 is selected.

Then, in the step S130, the queue managing unit 120 determines whether the selected command can be outputted or not. Following the preceding example, at the 14th cycle, the read with pre-charge command RP1 is selected in the step S120. Referring to the bank status table T1, the available outputting time of the read with pre-charge command RP1 is the 15th cycle, so the selected read with pre-charge command RP1 cannot be outputted at this time. Therefore, the process proceeds to the step S140.

If the selected command cannot be outputted, then the process proceeds to the step S140. In the step S140, the queue managing unit 120 determines whether all of the commands stored in the command queue Q1 have been selected.

If all of the commands stored in the command queue Q1 have been selected, the process proceeds to the step S110. If one of the commands stored in the command queue Q1 has not been selected, then the process returns to the step S120. Following the preceding example, the active command A0 and the write with pre-charge command WP0 are also stored in the command queue Q1, so the active command A0 can be selected in the S120. In the step S130, referring to the bank status table T0, the available outputting time of the active command A0 is the 14th cycle, so the active command A0 can be outputted at this time, and the process proceeds to the step S150.

In the step S150, the input and output unit 110 outputs the selected command to the memory, and the queue managing unit 120 stores the command and the outputting time thereof in the TMP queue Q2.

In the S160, if the time duration of one of the commands stored in the TMP queue Q2 is longer than the dependence interval, then the queue managing unit 120 removes part of the TMP queue Q2 to reduce the size of the TMP queue Q2. In detail, if the interval between the outputting time of one command stored in the TMP queue Q2 and the current time is larger than the dependence interval, then this command is removed.

In the step S170, the partial updating unit 130 updates some of the bank status tables, and others of the bank status tables are kept unchanged. In detail, the bank status tables corresponding with the commands stored in the command queue Q1 and the outputted commands are updated. Following the preceding example, at the 14th cycle, the commands stored in the command queue Q1 correspond with the 0th bank B0 and the 1st bank B1, and the command outputted at this time corresponds with the 0th bank B0. Therefore, only the bank status table T0 corresponding with the 0th bank B0 and the bank status table T1 corresponding with the 1st bank B1 are needed to be updated, and the bank status table T2 corresponding with the 2nd bank B2 and other bank status tables corresponding with to other banks are not needed to be updated.

According to the flowchart above, in the step S170, not all of the bank status tables are updated at each time. Only some of the bank status tables are updated. In the steps S180 and S190, if necessary, the unchanged bank status table can be recovered according to the TMP queue Q2. As such, the efficiency of the memory transaction-level modeling method can be greatly improved.

Figures 7, 8:
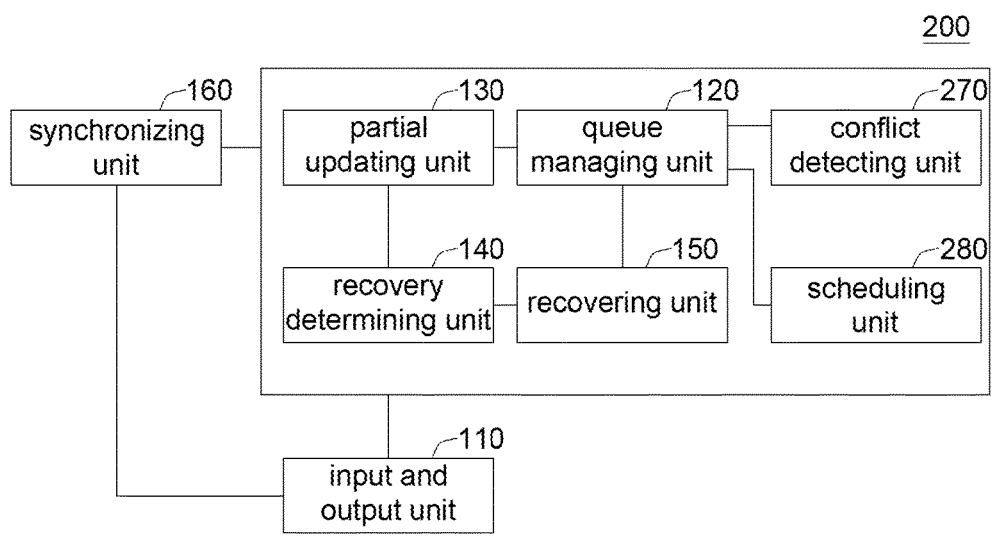
FIG. 7 illustrates an event-based memory transaction-level modeling method according to one embodiment.
FIG. 8 shows an event-based memory transaction-level modeling system.

Please refer to the FIG. 7, which illustrates the event-based memory transaction-level modeling method according to one embodiment. "Request Driven" is performed in the embodiment of the FIG. 7. As shown in the upper table of the FIG. 7, the read request event R0' is received at the 21th cycle, and the available outputting times of the active command A0 and the read with pre-charge command RP0 are scheduled at the 33th cycle and the 37th cycle respectively. Referring to the upper table of the FIG. 7, the available outputting time of the read with pre-charge command RP0 which is the last one is the 37th cycle.

As shown in the lower table of the FIG. 7, the write request event W1' is received at the 22th cycle. Because the 22th cycle is earlier than the available outputting time of the last command, i.e. the 37th cycle, a schedule conflict is happened. Therefore, in the lower table of the FIG. 7, the available outputting times are needed to be scheduled again. The commands each of whose available outputting time is later than the 22th cycle are scheduled again until the available outputting time of the last one of the at least one command of the write request event W1' is scheduled. After scheduling, the available outputting times of the active command A1, the active command A0 and the write with pre-charge command WP1 are the 29th cycle, the 33th cycle and the 34th cycle respectively. The available outputting time of the read with pre-charge command RP0 will be changed from the 37th cycle to the 42th cycle.

Please refer to FIG. 8, which shows an event-based memory transaction-level modeling system 200. The difference between the event-based memory transaction-level modeling system 200 of the FIG. 8 and the memory transaction-level modeling system 100 of the FIG. 5 is in that the event-based memory transaction-level modeling system 200 further comprises a conflict detecting unit 270 and a scheduling unit 280. The conflict detecting unit 270 is further for detecting whether a schedule conflict is happened. The scheduling unit 280 is used for scheduling the available outputting time. For example, the conflict detecting unit 270 and the scheduling unit 280 may be a chip, a circuit, a circuit board, a storage device storing a plurality of program codes, or a plurality of program codes executable by a processor, computer or a server.

Figure 9A:
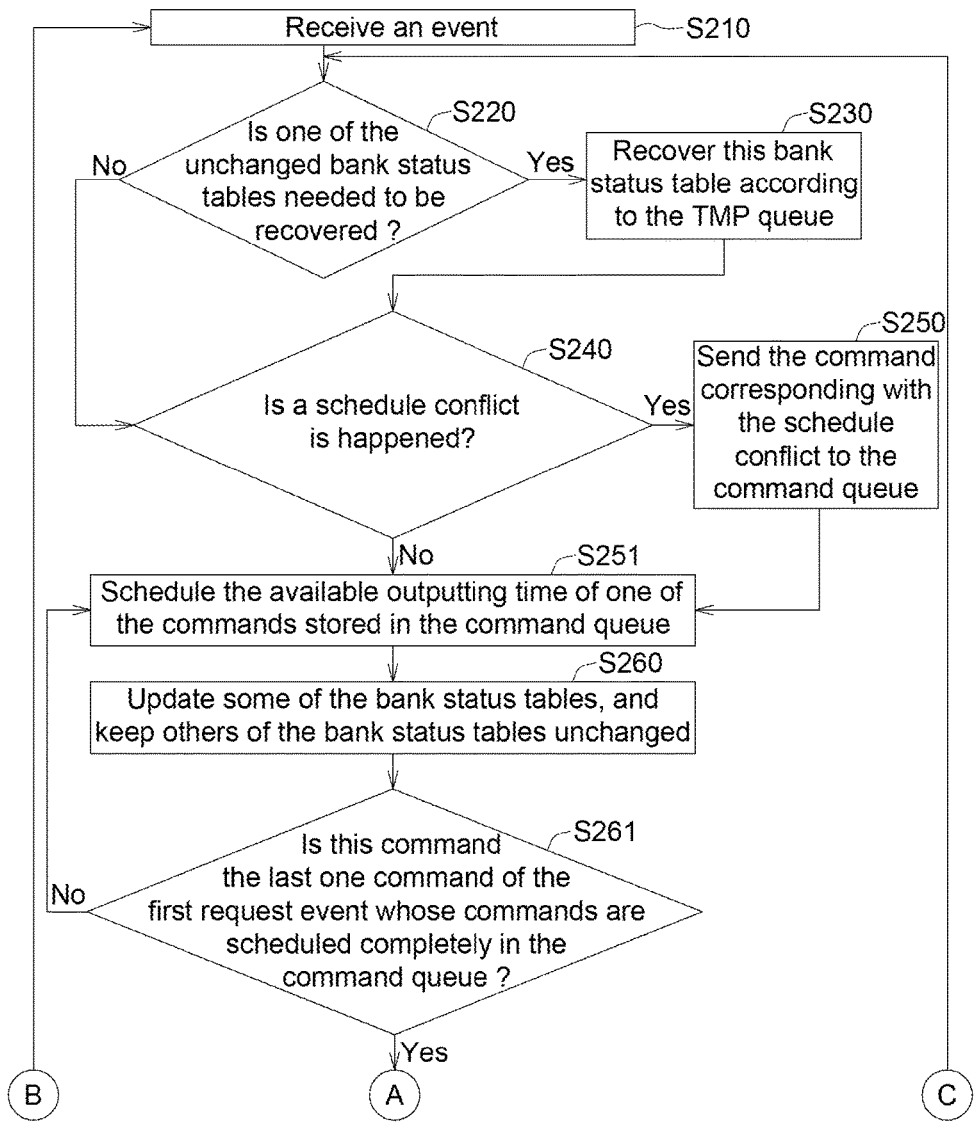
FIGS. 9A to 9B show a flowchart of an event-based memory transaction-level modeling method according to one embodiment.
Figures 9B, 10:
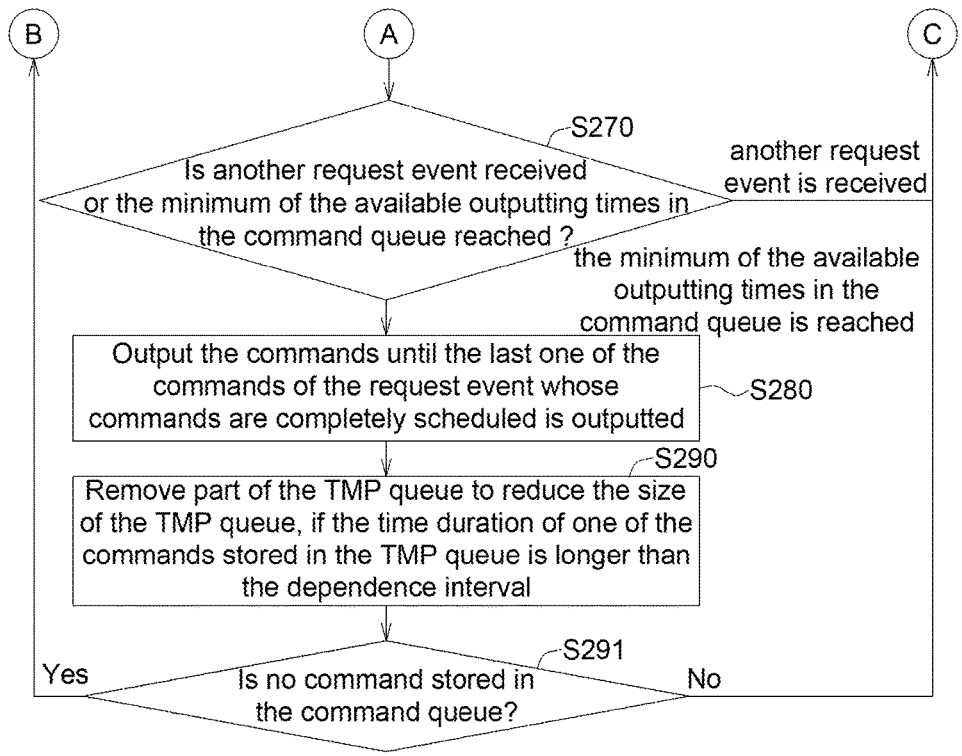
FIG. 10 illustrates an event-based memory transaction-level modeling method according to another embodiment.

The operation of the event-based memory transaction-level modeling system 200 is illustrated by a flowchart. Please refer to FIGS. 9A to 9B, which show a flowchart of the event-based memory transaction-level modeling method according to one embodiment. "The embodiment of FIGS. 9A to 9B shows the "Request Driven" method in which the timing of the model is synchronized when one request is received. In the step S210, an event is received. The event may be receiving a new request event or reaching a synchronizing time, such as reaching the minimum of the available outputting times in the command queue Q1. As shown in FIG. 7, the write request event W1' is received at the 22th cycle.

When the event is received, such as receiving a new request event, the queue managing unit 120 will store some commands corresponding with the newly received request event in the command queue Q1. As shown in FIG. 7, the write request event W1' is received at the 22th cycle, the queue managing unit 120 will store the active command A1 and the write with pre-charge command WP1 in the command queue Q1. In the step S220, the recovery determining unit 140 determines whether one of the unchanged bank status tables is needed to be recovered.

If one of the unchanged bank status tables is needed to be recovered, then the process proceeds to the step S230. In the step S230, the recovering unit 150 recovers this bank status table according to the TMP queue Q2.

If none of the unchanged bank status tables is needed to be recovered, then the process proceeds to the step S240. In the step S240, the conflict detecting unit 270 determines whether a schedule conflict is happened. The schedule conflict happens when the request event will affect the timing of the scheduled commands in the command queue.

If the schedule conflict is happened, then the process proceeds to the step S250. In the step S250, the command corresponding with the schedule conflict is sent to the command queue Q1. Following the preceding example in the FIG. 7, the 22th cycle is earlier than the available outputting time of the last one command in the upper table of the FIG. 7, i.e. the 37th cycle, so a schedule conflict is happened. Therefore, in the lower table of the FIG. 7, the command corresponding with the schedule conflict is sent to the command queue Q1 (not shown).

If no schedule conflict is happened, then the process proceeds to the step S251. In the step S251, the scheduling unit 280 schedules the available outputting time of one of the commands stored in the command queue Q1.

Next, in the step S260, the partial updating unit 130 updates some of the bank status tables, and keeps others of the bank status tables unchanged.

Then, in the step S261, the scheduling unit 280 determines whether this command is the last one command of the first request event whose commands are scheduled completely in the command queue Q1.

If this command is not the last one of the first request event in the command queue Q1, then the process proceeds to the step S251. If this command is the last one of the first request event in the command queue Q1, then the process proceeds to the step S270. In the present embodiment, the scheduling unit 280 schedules the available outputting times of the commands in the command queue Q1 until the available outputting time of the last one of the at least one command of the request event is scheduled. For example, in the lower table of FIG. 7, the available outputting times of the active command A1, the active command A0 and the write with pre-charge command WP1 are stored. In this example, the first request event whose commands are scheduled completely is the write request event W1'. It is noted that if the scheduled order is "the active command A1, the active command A0, the read with pre-charge command RP0", then the step of scheduling is performed until the read with pre-charge command RP0 is scheduled. In this example, the first request event whose commands are completely scheduled is the read request event R0'. In the step of S270, whether another request event is received or whether the minimum of the available outputting times in the command queue Q1 is reached is determined.

If another request event is received, then the process proceeds to the step S220.

If the minimum of the available outputting times in the command queue Q1 is reached, then the process proceeds to the step S280. In the step S280, the input and output unit 110 outputs the commands until the last one of the commands of the request event whose commands are completely scheduled is outputted. The queue managing unit 120 stores the outputted commands and the outputting times thereof in the TMP queue Q2. For example, in the lower table of the FIG. 7, the active command A1, the active command A0 and the write with pre-charge command WP1 are outputted, and the active command A1, the active command A0 and the write with pre-charge command WP1, and the available outputting times thereof are stored in the TMP queue Q2.

Then, in the S290, if the time duration of one of the commands stored in the TMP queue Q2 is longer than the dependence interval, then the queue managing unit 120 removes part of the TMP queue Q2 to reduce the size of the TMP queue Q2.

Next, in the step S291, whether no command is stored in the command queue Q1 is determined by the queue managing unit 120. If no command is stored in the command queue Q1, then the process proceeds to the S210, if at least one command is stored in the command queue Q1, then the process proceeds to the step S220.

According to the flowchart described above, not all of the bank status tables are updated in the step S260. Only some of the bank status tables are updated. If one of the bank status tables is needed to be recovered (step S220: Yes), then this unchanged bank status table can be recovered according to the TMP queue Q2 in the step S230. As such, the efficiency of the memory transaction-level modeling method can be greatly improved.

Please refer to FIG. 10, which illustrates the event-based memory transaction-level modeling method according to another embodiment. Compared to the embodiment in the FIG. 7, the embodiment of FIG. 10 shows the "Command Driven" method in which the timing of the model is synchronized when one request is received or one command is outputted. In this embodiment, the available outputting time of only one command is scheduled at each time. As shown in the upper table of FIG. 10, after the read request event R0' is received at the 21th cycle, the available outputting time of the active command A0 is scheduled at the 33th cycle.

As shown in the lower table of FIG. 10, the write request event W1' is received at the 22th cycle. The 22th cycle is earlier than the available outputting time, i.e. the 33th cycle, so the schedule conflict is happened. Therefore, the available outputting times in the lower table of the FIG. 10 are needed to be scheduled again. Any command with the available outputting time later than the 22th cycle is scheduled again. After scheduling, the available outputting time of the active command A1 is the 29th cycle and the available outputting time of the read with pre-charge command RP0 is not determined yet.

Figure 11A:
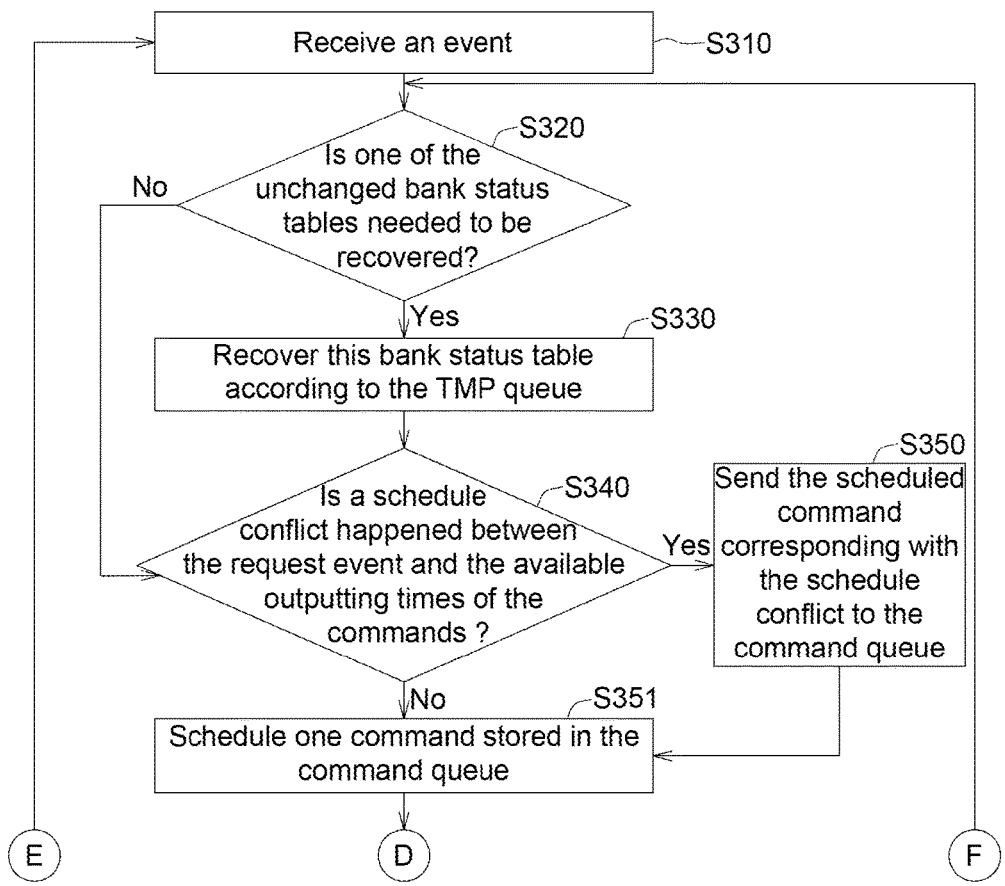
FIGS. 11A to 11B show a flowchart of an event-based memory transaction-level modeling method according to one embodiment.
Figure 11B:
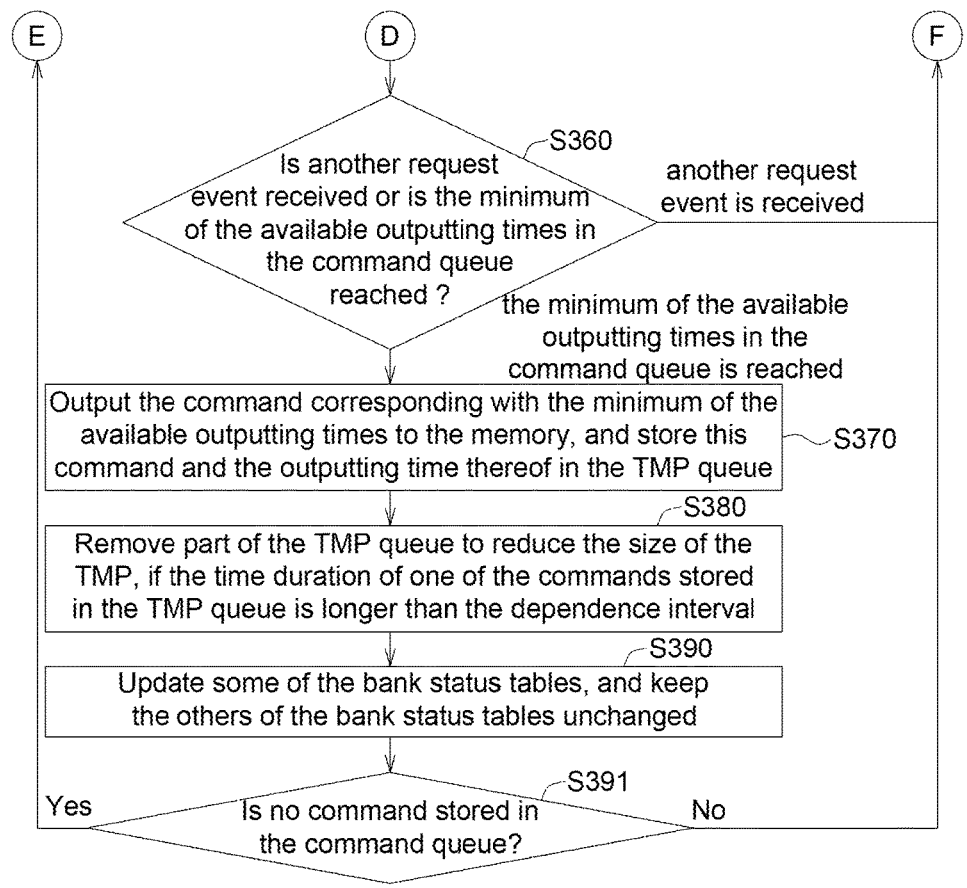

Please refer to FIGS. 11A to 11B, which show a flowchart of the event-based memory transaction-level modeling method according to one embodiment. "Command Driven" is performed in the embodiment of FIGS. 11A to 11B. In the step S310, an event is received. The event may be receiving a new request event or reaching a synchronizing time, such as reaching the minimum of the available outputting times in the command queue Q1. In FIG. 10, the write request event W1' is received at the 22th cycle.

After receiving the event, such as receiving a new request event, the queue managing unit 120 stores the commands corresponding with the newly received request event in the command queue Q1. In FIG. 10, the write request event W1' is received at the 22th cycle. The queue managing unit 120 stores the active command A1 and the write with pre-charge command WP1 in the command queue Q1. In the step S320, the recovery determining unit 140 determines whether one of the unchanged bank status tables is needed to be recovered.

If one of the unchanged bank status tables is needed to be recovered, then the process proceeds to the step S330. In the step S330, the recovering unit 150 recovers this bank status table according to the TMP queue Q2.

If none of the unchanged bank status tables is needed to be recovered, the process proceeds to the step S340. In the step S340, the conflict detecting unit 270 determines whether a schedule conflict is happened.

If a schedule conflict is happened, then the process proceeds to the step S350. In the step S350, the scheduled command corresponding with the schedule conflict is sent to the command queue Q1. Following the preceding example, the 22th cycle is earlier than the available outputting time, i.e. the 33th cycle, in the upper table of the FIG. 10, so a schedule conflict is happened. Therefore, the scheduled command is sent to the command queue Q1 (not shown).

If no schedule conflict is happened, then the process proceeds to the step S351. In the step S351, the scheduling unit 280 schedules one command stored in the command queue.

Then, in the S360, whether another request event is received or whether the minimum of the available outputting times in the command queue Q1 is reached is determined.

If another request event is received, then the process proceeds to the step S320.

If the minimum of the available outputting times in the command queue Q1 is reached, then the process proceeds to the step S370. In the step S370, the input and output unit 110 outputs the command corresponding with the minimum of the available outputting times to the memory, and the queue managing unit 120 store this command and the outputting time thereof in the TMP queue Q2.

Then, in the step S380, if the time duration of one of the commands stored in the TMP queue Q2 is longer than the dependence interval, then the queue managing unit 120 removes part of the TMP queue Q2 to reduce the size of the TMP queue Q2.

Next, in the step S390, the partial updating unit 130 updates some of the bank status tables, and keeps the others of the bank status tables unchanged.

Then, in the step S391, whether no command is stored in the command queue Q1 is determined. If no command is stored in the command queue Q1, then the process proceeds to the S310, if at least one command is stored in the command queue Q1, then the process proceeds to the step S320.

According to the flowchart described above, not all of the bank status tables are updated in the step S390. Only some of the bank status tables are updated. If one of the bank status tables is needed to be recovered (step S320: Yes), then this unchanged bank status table can be recovered according to the TMP queue Q2 in the step S330. As such, the efficiency of the memory transaction-level modeling method can be greatly improved.

Figure 12:
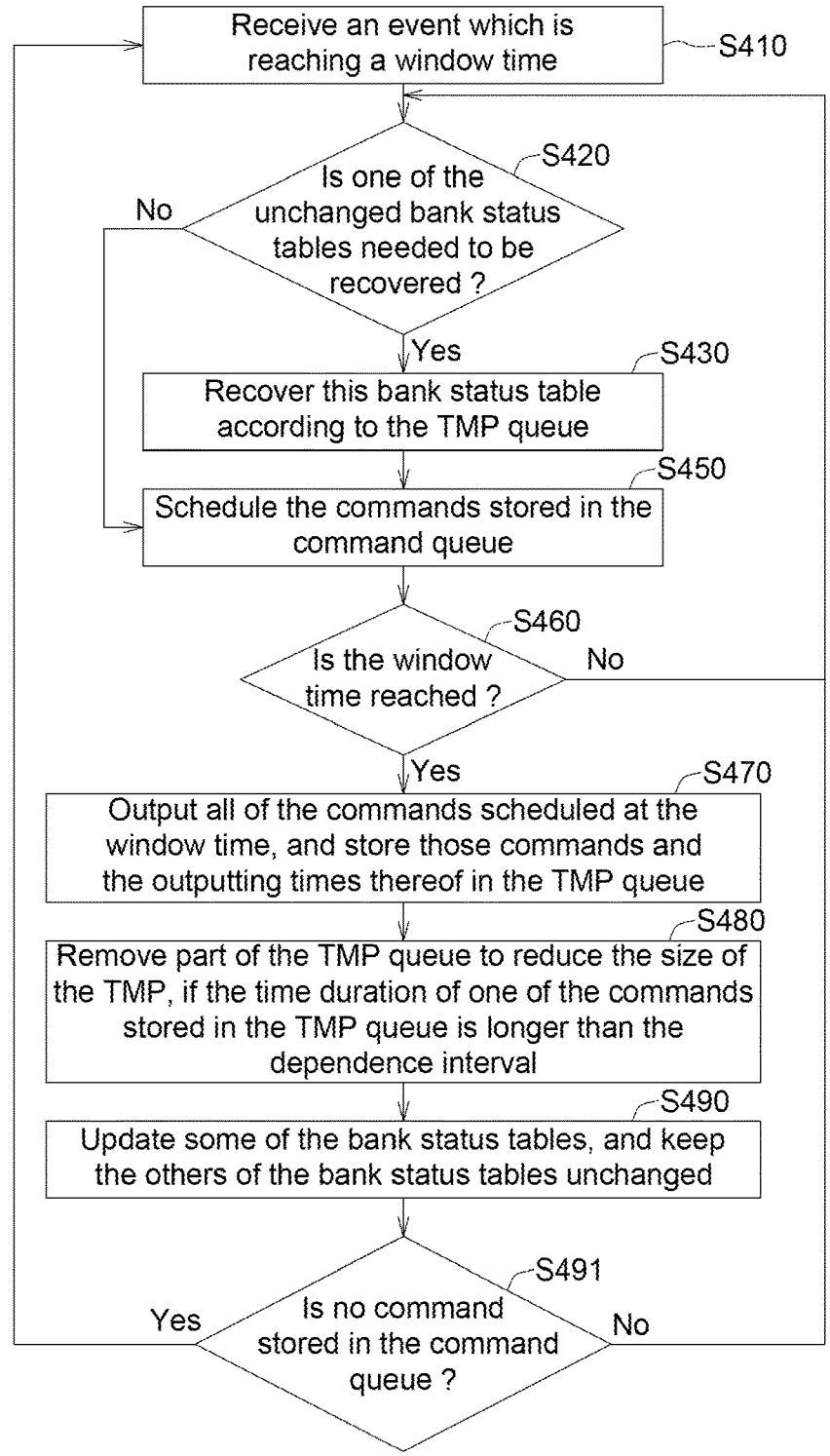
FIG. 12 shows a flowchart of a window-based memory transaction-level modeling method according to one embodiment.

Please refer to FIG. 12, which shows a flowchart of the window-based memory transaction-level modeling method according to one embodiment. In the embodiment of FIG. 12, the memory model is synchronized every fixed number of cycles. In the step S410, an event which is reaching a window time is received. In one embodiment, the window may include a fixed number of cycles and the window time may be the period of those cycles. For example, the window may include 20 cycles, and the window time may be the period of those 20 cycles. The window time is reached at every 20 cycles, i.e. the 20th cycle and the 40th cycle. In one embodiment, the window can be adjusted. For example, the number of cycles in the window may be changed from 20 to 10 for increasing the accuracy. Or, the number of cycles in the window may be increased to be 50 for increasing the simulation speed.

When the window time is reached, in the step S420, the recovery determining unit 140 determines whether one of the unchanged bank status tables is needed to be recovered. In one embodiment, when the window time is reached and a new request event is received, the commands corresponding with the newly received request event can be stored in the command queue Q1.

If one of the unchanged bank status tables is needed to be recovered, then the process proceeds to the S430. In the step S430, the recovering unit 150 recovers this bank status table according to the TMP queue Q2.

If none of the unchanged bank status tables is needed to be recovered, then the process proceeds to the step S450.

In the step S450, the scheduling unit 280 schedules the commands stored in the command queue. In one window time, one or more than one commands may be scheduled. For example, the number of the cycle in the window is 20, and two commands which are available to be outputted at the 10th cycle and the 15th cycle can be scheduled at the 20th cycle.

Next, in the step S460, whether the window time is reached is determined.

If the window time is not reached, then the process proceeds to the step S420.

If the window time is reached, then the process proceeds to the step S470. In the step S470, all of the commands scheduled at the window time are outputted, and the queue managing unit 120 stores those commands and the outputting times thereof in the TMP queue Q2.

Then, in the step S480, if the time duration of one of the commands stored in the TMP queue Q2 is longer than the dependence interval, then the queue managing unit 120 removes part of the TMP queue Q2 to reduce the size of the TMP queue Q2.

Next, in the step S490, the partial updating unit 130 updates some of the bank status tables, and keeps the others of the bank status tables unchanged.

Afterwards, in the step S491, whether no command is stored in the command queue Q1 is determined. If no command is stored in the command queue Q1, then the process proceeds to the S410, if at least one command is stored in the command queue Q1, then the process proceeds to the step S420.

According to the flowchart described above, not all of the bank status tables are updated in the step S490. Only some of the bank status tables are updated. If one of the bank status tables is needed to be recovered (step S420: Yes), then this unchanged bank status table can be recovered according to the TMP queue in the step S430. As such, the efficiency of the memory transaction-level modeling method can be greatly improved.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A memory transaction-level modeling method, used for simulating an operation of outputting at least one command to a memory, wherein the memory includes a plurality of banks which correspond with a plurality of bank status tables respectively, and the memory transaction-level modeling method comprises:
   receiving an event;
   determining, according to a command queue or at least one command to be output, whether one of the bank status tables is needed to be recovered;
   recovering, according to a temporary queue (TMP queue), one of the bank status tables which is needed to be recovered;
   outputting the at least one command from the command queue to the memory according to the command queue and storing the at least one command which is outputted in the TMP queue; and
   updating the bank status table(s), which is(are) corresponding to the event or the at least one command being outputted, and keeping the bank status table(s), which is(are) not corresponding to the event and not corresponding to the at least one command being outputted, unchanged.

2. The memory transaction-level modeling method according to claim 1, wherein the at least one command which is outputted and an outputting time thereof are stored in the TMP queue.

3. The memory transaction-level modeling method according to claim 2, wherein in the step of recovering one of the bank status tables according to the temporary queue, one of the bank status tables is recovered according to the at least one command and a sequence of the outputting time of the at least one command stored in the TMP queue.

4. The memory transaction-level modeling method according to claim 1, wherein in the step of updating some of the bank status tables, some of the bank status tables which correspond with the command queue and the at least one command which is currently outputted are updated.

5. The memory transaction-level modeling method according to claim 1, further comprising:
reducing a size of the TMP queue.

6. The memory transaction-level modeling method according to claim 5, wherein in the step of reducing the size of the TMP queue, part of the TMP queue is removed according to a dependence interval.

7. The memory transaction-level modeling method according to claim 6, wherein in the step of reducing the size of the TMP queue, one of the at least one command in the TMP queue is removed, and an interval between an outputting time of the command which is removed and a current time is larger than the dependence interval.

8. The memory transaction-level modeling method according to claim 1, wherein each of the at least one command corresponds with an available outputting time, and the memory transaction-level modeling method further comprises:
determining whether a schedule conflict is happened, wherein the schedule conflict happens when a request event will affect a timing of the commands in the command queue; and
sending the at least one command corresponding with the schedule conflict to the command queue, and scheduling the available outputting time of the at least one command in the command queue, until the available outputting time of at last one of the at least one command of the event is scheduled, if the schedule conflict is happened.

9. The memory transaction-level modeling method according to claim 8, further comprising:
determining whether a minimum of the available outputting time of the at least one command in the command queue is reached; and
outputting the at least one command, until the last one of the at least one command of the event is outputted, if the minimum of the available outputting time of the at least one command in the command queue is reached.

10. The memory transaction-level modeling method according to claim 1, wherein each of the at least one command corresponds with an available outputting time, the memory transaction-level modeling method further comprises:
determining whether the available outputting time of the at least one command has a schedule conflict with the event; and
sending the at least one command whose available outputting time has the schedule conflict with the event to the command queue, and scheduling the available outputting time of the at least one command in the command queue, if the schedule conflict is happened.

11. The memory transaction-level modeling method according to claim 10, further comprising:
determining whether a minimum of the available outputting time of the at least one command in the command queue is reached; and
outputting the at least one command, if the minimum of the available outputting time of the at least one command in the command queue is reached.

12. The memory transaction-level modeling method according to claim 1, wherein each of the at least one command corresponds with an available outputting time, and the memory transaction-level modeling method further comprises:

determining whether a window time is reached; and
outputting all of the at least one command which is within the window time, if the window time is reached.

13. The memory transaction-level modeling method according to claim 1, wherein in the step of determining whether one of the bank status tables is needed to be recovered, one of the bank status tables which corresponds with the command queue and is kept unchanged is needed to be recovered.

14. The memory transaction-level modeling method according to claim 1, wherein in the step of determining whether one of the bank status tables is needed to be recovered, one of the bank status tables which corresponds with the at least one command which is outputted and is kept unchanged is needed to be recovered.

15. The memory transaction-level modeling method according to claim 1, wherein the memory transaction-level modeling method is a cycle-based memory transaction-level modeling method, a window-based memory transaction-level modeling method, or an event-based memory transaction-level modeling method.

16. The memory transaction-level modeling method according to claim, 1, wherein the command queue stores the at least one command which is ready to be executed.

17. A memory transaction-level modeling system, used for simulating an operation of outputting at least one command to a memory, wherein the memory includes a plurality of banks which correspond with a plurality of bank status tables respectively, and the memory transaction-level modeling system comprises:
a recovery determining unit for determining, according to a command queue or at least one command to be output, whether one of the bank status tables is needed to be recovered;
a recovering unit for recovering, according to a temporary queue (TMP queue), one of the bank status tables which is needed to be recovered;
an input and output unit for outputting the at least one command from the command queue to the memory according to a command queue;
a queue managing unit for storing the at least one command which is outputted in the TMP queue; and
a partial updating unit for updating the bank status table(s), which is(are) corresponding to the event or the at least one command being outputted, and keeping the bank status table(s), which is(are) not corresponding to the event and not corresponding to the at least one command being outputted, unchanged.

18. The memory transaction-level modeling system according to claim 17, wherein queue managing unit stores the at least one command which is outputted and an outputting time thereof in the TMP queue.

19. The memory transaction-level modeling system according to claim 18, wherein the recovering unit recovers one of the bank status tables according to the at least one command and a sequence of the outputting time of the at least one command in the TMP queue.

20. The memory transaction-level modeling system according to claim 17, wherein the partial updating unit updates some of the bank status tables which correspond with the command queue and the at least one command which is currently outputted.

21. The memory transaction-level modeling system according to claim 17, wherein the queue managing unit is further for reducing a size of the TMP queue.

22. The memory transaction-level modeling system according to claim 21, wherein the queue managing unit removes part of the TMP queue according to a dependence interval.

23. The memory transaction-level modeling system according to claim 22, wherein the queue managing unit removes one of the at least one command in the TMP queue, and an interval between an outputting time of the command which is removed and a current time is larger than the dependence interval.

24. The memory transaction-level modeling system according to claim 17, wherein the input and output unit is further for receiving an event, each of the at least one command corresponds with an available outputting time, and the memory transaction-level modeling system further comprises:
 a conflict detecting unit for determining whether a schedule conflict is happened, wherein the schedule conflict happens when a request event will affect a timing of the commands in the command queue; and
 a scheduling unit for sending the at least one command corresponding with the schedule conflict to the command queue, and scheduling the available outputting time of the at least one command in the command queue, until the available outputting time of at last one of the at least one command of the event is scheduled, if the schedule conflict is happened.

25. The memory transaction-level modeling system according to claim 24, wherein if a minimum of the available outputting time of the at least one command in the command queue is reached, then the input and output unit outputs the at least one command, until the last one of the at least one command of the event is outputted.

26. The memory transaction-level modeling system according to claim 17, wherein the input and output unit is further for receiving an event, each of the at least one command corresponds with an available outputting time, and the memory transaction-level modeling system further comprises:
 a conflict detecting unit for determining whether a schedule conflict is happened, wherein the schedule conflict happens when a request event will affect a timing of the commands in the command queue; and
 a scheduling unit for sending the at least one command corresponding with the schedule conflict to the command queue, and scheduling the available outputting time of the at least one command in the command queue, if the schedule conflict is happened.

27. The memory transaction-level modeling system according to claim 24, wherein if a minimum of the available outputting time of the at least one command in the command queue is reached, then the input and output unit outputs the at least one command.

28. The memory transaction-level modeling system according to claim 17, wherein if a window time is reached, then the input and output unit outputs all of the at least one command which is within the window time.

29. The memory transaction-level modeling system according to claim 17, wherein the recovery determining unit determines that one of the bank status tables which corresponds with the command queue and is kept unchanged is needed to be recovered.

30. The memory transaction-level modeling system according to claim 17, wherein the recovery determining unit determines that one of the bank status tables which corresponds with the at least one command which is outputted and is kept unchanged is needed to be recovered.

* * * * *